(12) United States Patent
Han et al.

(10) Patent No.: US 10,192,504 B2
(45) Date of Patent: Jan. 29, 2019

(54) SHIFT REGISTER, GOA CIRCUIT CONTAINING THE SAME, AND RELATED DISPLAY DEVICE

(71) Applicant: BOE TECHNOLOGY GROUP CO., LTD, Beijing (CN)

(72) Inventors: Mingfu Han, Beijing (CN); Seungwoo Han, Beijing (CN); Guangliang Shang, Beijing (CN); Hyunsic Choi, Beijing (CN); Xing Yao, Beijing (CN); Haoliang Zheng, Beijing (CN); Xue Dong, Beijing (CN); Jungmok Jun, Beijing (CN); Yunsik Im, Beijing (CN)

(73) Assignee: BOE TECHNOLOGY GROUP CO., LTD, Beijing (CN)

( * ) Notice: Subject to any disclaimer, the term of this patent is extended or adjusted under 35 U.S.C. 154(b) by 161 days.

(21) Appl. No.: 15/501,265

(22) PCT Filed: Jul. 1, 2016

(86) PCT No.: PCT/CN2016/088181
§ 371 (c)(1),
(2) Date: Feb. 2, 2017

(87) PCT Pub. No.: WO2017/071278
PCT Pub. Date: May 4, 2017

(65) Prior Publication Data
US 2017/0270879 A1 Sep. 21, 2017

(30) Foreign Application Priority Data
Oct. 28, 2015 (CN) .......................... 2015 1 0713668

(51) Int. Cl.
*G11C 19/00* (2006.01)
*G09G 3/36* (2006.01)
*G11C 19/28* (2006.01)

(52) U.S. Cl.
CPC ........... *G09G 3/3648* (2013.01); *G11C 19/28* (2013.01); *G09G 3/3677* (2013.01);
(Continued)

(58) Field of Classification Search
None
See application file for complete search history.

(56) References Cited

U.S. PATENT DOCUMENTS

2010/0263012 A1 10/2010 Huang et al.
2011/0057926 A1* 3/2011 Shang .................. G09G 3/3677
345/213

(Continued)

FOREIGN PATENT DOCUMENTS

CN 202443728 U 9/2012
CN 103559867 A 2/2014
(Continued)

OTHER PUBLICATIONS

The World Intellectual Property Organization (WIPO) International Search Report for PCT/CN2016/088181 dated Oct. 10, 2016 p. 1-14.

*Primary Examiner* — Tuan T Lam
(74) *Attorney, Agent, or Firm* — Anova Law Group, PLLC (57) ABSTRACT

The present disclosure provides a shift register, including: an input unit, an output control unit, a first pull-down unit, a second pull-down unit, a reset unit, and a pull-down control unit. The input unit comprises a control terminal connected to a signal input terminal, a first terminal connected to a first voltage terminal, and a second terminal connected to a first node. The output control unit comprises a control terminal connected to the first node, a first terminal connected to a first clock signal terminal, and a second terminal connected to a signal output terminal. The first pull-down unit comprises a control terminal connected to a second node, a first (Continued)

terminal connected to the first node, and a second terminal connected to a compensation signal terminal. The second pull-down unit comprises a control terminal connected to the compensation signal terminal, and a first terminal connected to the second node.

21 Claims, 7 Drawing Sheets

(52) U.S. Cl.
CPC ............... *G09G 2300/0408* (2013.01); *G09G 2300/0426* (2013.01); *G09G 2310/0286* (2013.01); *G09G 2310/08* (2013.01)

(56) References Cited

U.S. PATENT DOCUMENTS

| | | | | |
|---|---|---|---|---|
| 2011/0286572 | A1* | 11/2011 | Shang | G11C 19/28 377/67 |
| 2012/0113088 | A1* | 5/2012 | Han | G09G 3/3674 345/212 |
| 2012/0262438 | A1* | 10/2012 | Shang | G11C 19/28 345/211 |
| 2016/0307641 | A1* | 10/2016 | Zheng | G09G 3/3677 |
| 2018/0108426 | A1* | 4/2018 | Zheng | G11C 19/28 |

FOREIGN PATENT DOCUMENTS

| | | | |
|---|---|---|---|
| CN | 104934011 | A | 9/2015 |
| CN | 105206243 | A | 12/2015 |
| CN | 205069085 | U | 3/2016 |
| KR | 20050114850 | A | 12/2005 |

\* cited by examiner

SHIFT REGISTER, GOA CIRCUIT CONTAINING THE SAME, AND RELATED DISPLAY DEVICE

CROSS-REFERENCES TO RELATED APPLICATIONS

This PCT patent application is a national phase entry under 35 U.S.C. § 371 of International Application No. PCT/CN2016/088181, filed on Jul. 1, 2016, which claims priority of Chinese Patent Application No. 201510713668.5, filed on Oct. 28, 2015 The above enumerated patent applications are incorporated by reference herein in their entirety.

TECHNICAL FIELD

The present invention generally relates to the display technologies and, more particularly, relates to a shift register, a gate-driver on array (GOA) circuit containing the shift register, and a related display device.

BACKGROUND

Liquid crystal display (LCD) devices are light weighted and low in power consumption. Nowadays, LCD devices are widely used in various electronic products. Gate-driver on Array (GOA) technology contributes to an important technical part of the rapid development of the LCD devices. According to GOA technology, shift registers are integrated on the pixel array substrate. The scanning and driving of the LCD panel are implemented through the controlling of thin-film transistors (TFTs). Also, GOA and pixel array substrate can be formed through one fabrication step, reducing the fabrication cost. Compared to conventional chip on film (COF) technology and chip on glass (COG) technology, GOA technology requires lower power consumption and improves the integration level of the LCD panel. Thus, less packaging area is needed for the LCD panel, and narrow bezel design can be obtained.

However, some issues exist in conventional GOA technology. For example, shift registers are highly dependent on TFTs. Especially, the threshold voltages of the TFTs can have significant impact on the stability of the shift registers. The instability of the threshold voltages of the TFTs can cause instability of the shift registers. As a result, in operation, the shift registers may not function properly or may even fail.

BRIEF SUMMARY

The present disclosure provides a shift register, a GOA circuit, and a display device containing the shift register. Instability or failure in conventional shift registers, after operating for a long period of time, can be improved.

One aspect of the present disclosure includes a shift register. The shift register includes an input unit, an output control unit, a first pull-down unit, a second pull-down unit, a reset unit, and a pull-down control unit. The input unit comprises a control terminal connected to a signal input terminal, a first terminal connected to a first voltage terminal, and a second terminal connected to a first node. The output control unit comprises a control terminal connected to the first node, a first terminal connected to a first clock signal terminal, and a second terminal connected to a signal output terminal. The first pull-down unit comprises a control terminal connected to a second node, a first terminal connected to the first node, and a second terminal connected to a compensation signal terminal. The second pull-down unit comprises a control terminal connected to the compensation signal terminal, a first terminal connected to the second node, and a second terminal connected to a second voltage terminal. The pull-down control unit comprises a first control terminal connected to the signal input terminal, a second control terminal connected to the first node, a first terminal connected to the second node, a second terminal connected to the second voltage terminal. The reset unit comprises a control terminal connected to a reset signal terminal, a first terminal connected to the first node, a second terminal connected to the second voltage terminal. The first clock signal terminal and the second clock signal terminal input signals of opposite polarities in a scanning period in a frame, and input a turn-off signal in a blanking period in a frame. The compensation signal terminal inputs a turn-off signal in the scanning period in a frame and inputs a turn-on signal in the blanking period in a frame.

Optionally, the second pull-down unit includes a first thin-film transistor (TFT). The first TFT includes: a gate electrode connected to the compensation signal terminal, a source electrode connected to a second voltage terminal, a drain electrode connected to the second node.

Optionally, the first pull-down unit includes a fourth TFT. The fourth TFT includes: a gate electrode connected to the second node, a source electrode connected to the first node, and a drain electrode connected to the compensation signal terminal.

Optionally, the output control unit includes a thirteenth TFT and a capacitor. The thirteenth TFT includes: a gate electrode connected to the first node, a source electrode connected to the first clock signal terminal, and a drain electrode connected to the signal output terminal, the capacitor being connected between the first node and the signal output terminal.

Optionally, the shift register further includes a third pull-down unit. The third pull-down unit includes: a first control terminal connected to the second clock signal terminal, a first terminal connected to the signal output terminal, and a second terminal connected to the second voltage terminal.

Optionally, the third pull-down unit includes a second TFT. The second TFT includes: a gate electrode connected to the second clock signal terminal, a source electrode connected to the signal output terminal, a drain electrode connected to the compensation signal terminal.

Optionally, the third pull-down unit further includes a second control terminal connected to the second node, a turn-on signal inputted by the second control terminal connecting the compensation signal terminal with the signal output terminal.

Optionally, the first pull-down unit includes a third TFT. The third TFT includes: a gate electrode connected to the second node, a source electrode connected to the signal output terminal, and a drain electrode connected to the compensation signal terminal.

Optionally, the pull-down control unit includes a sixth TFT and an eighth TFT. The sixth TFT includes: a gate electrode connected to the first node, a source electrode connected to the second node, and a drain electrode connected to the second voltage terminal. The eighth TFT includes: a gate electrode and a drain electrode connected to the second clock signal terminal, and a source electrode connected to the second node.

Optionally, the pull-down control unit further includes a third control terminal connected to the first clock signal terminal and a fourth control terminal connected to the signal input terminal.

Optionally, the shift register further includes a fifth TFT connected between the second voltage terminal and the second node. The fifth TFT includes: a gate electrode connected to the signal input terminal, a drain electrode connected to the second clock signal terminal, and a source electrode connected to the second node.

Optionally, the shift register further includes a seventh TFT connected between the compensation signal terminal and the second node. The seventh TFT includes: a gate electrode connected the first clock signal terminal, a drain electrode connected to the compensation signal terminal, and a source electrode connected to the second node.

Optionally, the reset unit includes a tenth TFT. The tenth TFT includes: a gate electrode connected to the reset signal terminal; a drain electrode connected to the second voltage terminal; and a source electrode connected to the first node.

Optionally, the reset unit further includes a ninth TFT connected between the output signal terminal and the second voltage terminal. The ninth TFT includes: a gate electrode connected to the reset signal terminal; a drain electrode connected to the second voltage terminal; and a source electrode connected to the output signal terminal.

Optionally, the shift register further includes a final-reset unit. The final-reset unit includes a control terminal connected to a total reset signal terminal, an input terminal connected to the first node, and a second terminal connected to the second voltage terminal. The final-reset unit connects the first node with the second voltage terminal when the total reset terminal inputs a turn-on signal to the final-reset unit.

Optionally, the final-reset unit includes an eleventh TFT. The eleventh TFT includes a gate electrode connected to the total reset signal terminal, a source electrode connected to the first node, and a drain electrode connected to the second voltage terminal.

Optionally, the shift register further includes a start-reset unit. The start-reset unit includes a control terminal and an input terminal connected to a frame-start signal terminal, and a second terminal connected to the second node. The start-reset unit pulls up the voltage level of the second node when the frame-start signal terminal inputs a turn-on signal to the start-reset unit.

Optionally, the start-reset unit includes a twelfth TFT. The twelfth TFT includes a gate electrode and a source electrode connected to the frame-start signal terminal, and a drain electrode connected to the second node.

Another aspect of the present disclosure provides a gate-driver on array (GOA) circuit. The GOA circuit includes a plurality of the disclosed shift register cascading together. Except for a last shift register, the signal output terminal of one other shift register inputs a triggering signal to the signal input terminal of a next and adjacent shift register.

Optionally, except for a first shift register, the signal output terminal of one other shift register inputs a reset signal to the reset signal terminal of a previous and adjacent shift register.

Another aspect of the present disclosure provides a display device, including one or more of the disclosed GOA circuits.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

For those skilled in the art to better understand the technical solution of the invention, reference will now be made in detail to exemplary embodiments of the invention, which are illustrated in the accompanying drawings. Wherever possible, the same reference numbers will be used throughout the drawings to refer to the same or like parts.

Figure 1:
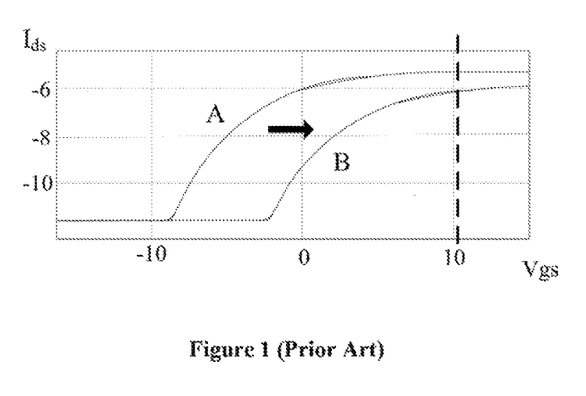
FIG. 1 illustrates a plot of source-drain current (Ids) as a function of gate-source voltage (Vgs) according to conventional GOA technology.

FIG. 1 illustrates a plot of source-drain current (Ids) as a function of gate-source voltage (Vgs) according to conventional GOA technology. As shown in FIG. 1, curve A represents the Ids-Vgs curve when a TFT has been operated for a short period of time, and curve B represents the Ids-Vgs curve when the TFT has been operated for a long period of time. When a TFT has been operated for a long time, the threshold voltage of the TFT often undergoes a positive shift under the effect of positive strain. The positive shift causes the Ids-Vgs curve of the TFT to shift towards right of the plot. That is, at the same turn-on voltage, the turn-on current or drain-to-source current of the TFT is reduced. The TFT may have impaired performance or instability, which can adversely affect the output of the shift register. The shift register may not function properly or may even fail.

One aspect of the present disclosure provides a shift register.

Figure 2:
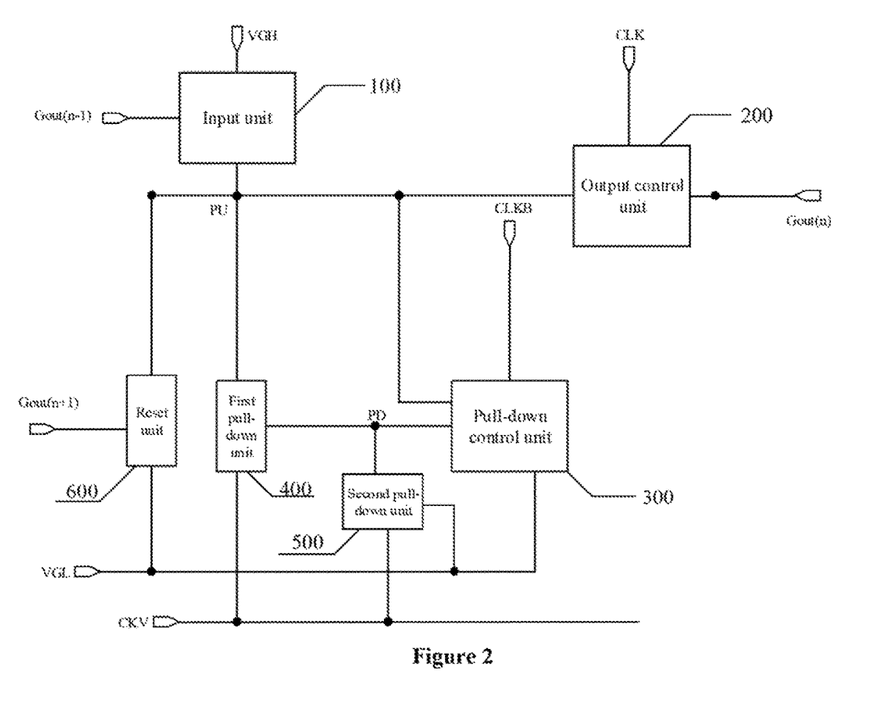
FIG. 2 illustrates an exemplary structure of a shift register according to various disclosed embodiments of the present disclosure.

FIG. 2 illustrates an exemplary structure of the disclosed shift register. The shift register may include an input unit 100, an output control unit 200, a pull-down control unit 300, a first pull-down unit 400, a second pull-down unit 500, and a reset unit 600.

The control terminal of the input unit 100 may be connected to a signal input terminal Gout(n−1). The first terminal of the input unit 100 may be connected to a first voltage terminal VGH. The second terminal of the input unit 100 may be connected to a first node PU. In some embodiments, the first voltage terminal VGH may provide a high-level voltage or a turn-on signal.

The control terminal of the output control unit 200 may be connected to the first node PU. The first terminal of the output control unit 200 may be connected to a first clock signal terminal CLK. The second terminal of the output control unit 200 may be connected to a signal output terminal Gout(n). The input unit 100 may pull up the voltage level of the first node PU when the signal input terminal Gout(n−1) inputs a turn-on signal to the input unit 100. When the first clock signal terminal CLK inputs a turn-on signal to the output control unit 200 and the voltage level of the first node PU is high, the output control unit 200 may control the signal output terminal Gout(n) to output a turn-on signal.

The first control terminal of the pull-down control unit 300 may be connected to second clock signal terminal CLKB. The second control terminal of the pull-down control unit 300 may be connected to the first node PU. The first terminal of the pull-down control unit 300 may be connected to a second node PD. The second terminal of the pull-down control unit 300 may be connected to a second voltage terminal VGL. In some embodiments, the second voltage terminal VGL may provide a low-level voltage or a turn-off signal.

The control terminal of the first pull-down unit 400 may be connected to the second node PD. The first terminal of the first pull-down unit 400 may be connected to the first node PU. The second terminal of the first pull-down unit 400 may be connected to a compensation signal terminal CKV. The first pull-down unit 400 may control the first node PU to be connected with the compensation signal terminal CKV when the voltage level of the second node PD is high.

The control terminal of the second pull-down unit 500 may be connected to the compensation signal terminal CKV. The first terminal of the second pull-down unit 500 may be connected to the second node PD. The second terminal of the second pull-down unit 500 may be connected to the second voltage terminal VGL. The second pull-down unit 500 may pull down the voltage level of the second node PD when the compensation signal terminal CKV inputs a turn-on signal to the second pull-down unit 500.

The control terminal of the reset unit 600 may be connected to a reset signal terminal Gout(n+1). The first terminal of the reset unit 600 may be connected to the first node PU. The second terminal of the reset unit 600 may be connected to the second voltage terminal VGL. The reset unit 600 may connect the first node PU with the second voltage terminal VGL when the reset signal terminal Gout (n+1) outputs a turn-on signal to the reset unit 600.

In operation, the first clock signal terminal CLK and the second clock signal terminal CLKB may input signals of opposite polarities in a scanning period in a frame, and may each input a turn-off signal in a blanking period in a frame. The compensation signal terminal CKV may input a turn-off signal in the scanning period in a frame and may input a turn-on signal in the blanking period in a frame. In some embodiments, a turn-on signal may be a high-level voltage, and a turn-off signal may be a low-level voltage. The second pull-down unit 500 may ensure the voltage applied between the control terminal and the second terminal of the first pull-down unit 400 have opposite polarities during a scanning period and a blanking period. For a TFT used in the first pull-down unit 400, the positive shift of the threshold voltage generated during the scanning period may be offset by the negative shift of the threshold voltage generated during the blanking period. The total shift of the threshold voltage of the TFT may be reduced. Instability or failure of a TFT caused by threshold voltage shift, after operating for a long period of time, may be reduced or eliminated.

Figure 3:
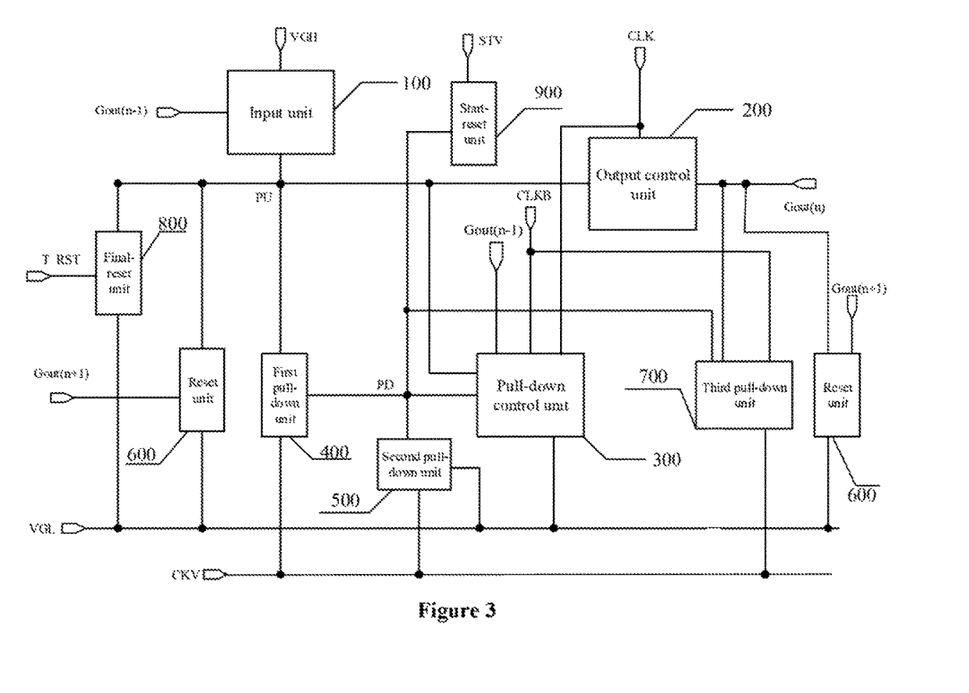
FIG. 3 illustrates another exemplary structure of a shift register according to various disclosed embodiments of the present disclosure.

FIG. 3 illustrates another exemplary structure of the disclosed shift register.

As shown in FIG. 3, in some embodiments, the shift register may further include a third pull-down unit 700. The first control terminal of the third pull-down unit 700 may be connected to the second clock signal terminal CLKB. The second control terminal of the third pull-down unit 700 may be connected to the second node PD. The first terminal of the third pull-down unit 700 may be connected to the signal output terminal Gout(n). The second terminal of the third pull-down unit 700 may be connected to the compensation signal terminal CKV. The third pull-down unit 700 may control the signal output terminal Gout(n) to be connected with the compensation signal terminal CKV when the second clock signal terminal CLKB inputs a turn-on signal to the third pull-down unit 700 or when the second node PD is of high voltage level.

As shown in FIG. 3, in some embodiments, the shift register may further include a final-reset unit 800. The control terminal of the final-reset unit 800 may be connected to a total reset signal terminal T_RST. The first terminal of the final-reset unit 800 may be connected to the first node PU. The second terminal of the final-reset unit 800 may be connected to the second voltage terminal VGL. The final-reset unit 800 may connect the first node PU with the second voltage terminal VGL when the total reset terminal T_RST inputs a turn-on signal to the final-reset unit 800. Thus, the voltage level of the first node PU may be pulled down after the scanning of each frame in the scanning periods.

As shown in FIG. 3, in some embodiments, the shift register may further include a start-reset unit 900. The control terminal and the first terminal of the start-reset unit 900 may be connected to a frame-start signal terminal STV. The second terminal of the start-reset unit 900 may be connected to the second node PD. The start-reset unit 900 may pull up the voltage level of the second node PD when the frame-start signal terminal STV inputs a turn-on signal to the start-reset unit 900. Thus, when the voltage level of the second node PD is high, the first pull-down unit 400 and the third pull-down unit 700 may be turned on or enabled. The voltage levels of the first node PU and the signal output terminal Gout(n) may be pulled down. The signal output terminal Gout(n) and the first node PU may output less or no noise.

Figure 4:
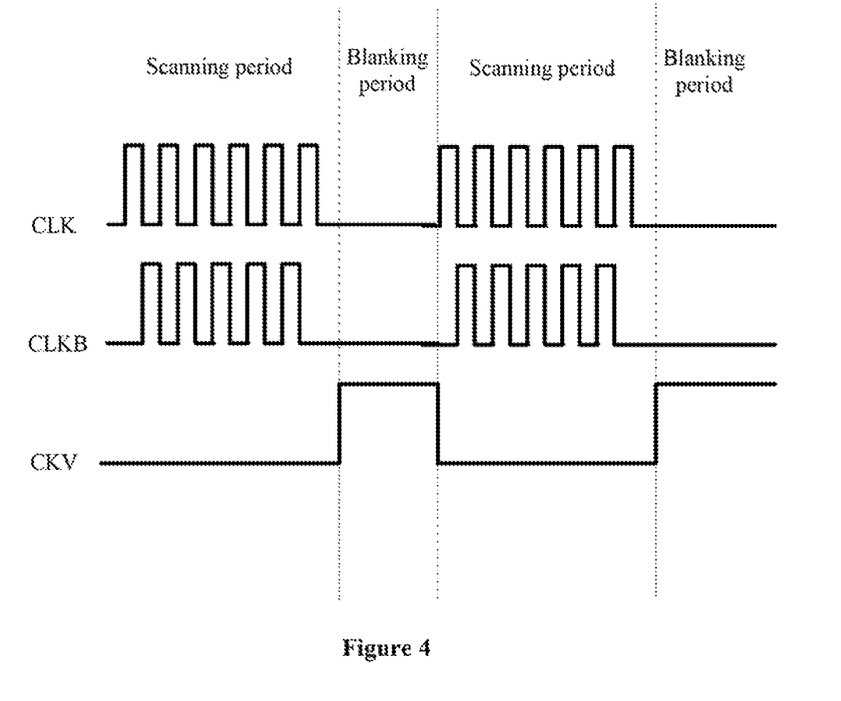
FIG. 4 illustrates exemplary timing diagrams of certain signals according to various disclosed embodiments of the present disclosure.

FIG. 4 illustrates timing diagrams of the signals outputted by the first clock signal terminal CLK, the second clock signal terminal CLKB, and the compensation signal terminal CKV. As shown in FIG. 4, in a scanning period, the signal inputted by the first clock signal terminal CLK and the signal inputted by the second clock signal terminal CLKB may have opposite polarities. In a blanking period, the first clock signal terminal CLK and the second clock signal terminal CLKB may both input a turn-off signal to the shift register. The compensation signal terminal may input a turn-off signal in the scanning period, and may input a turn-on signal in the blanking period.

The disclosed shift register applies a compensation signal terminal CKV that functions as a second voltage terminal in the scanning periods, and functions as a turn-on signal terminal in the blanking periods. The compensation signal terminal CKV may be connected to the second terminal of the third pull-down unit 700. The first control terminal of the third pull-down unit 700 may be connected to the second clock signal terminal CLKB.

In some embodiments, the pull-down control unit 300 may further include a third control terminal connected to the first clock signal terminal CLK, and a fourth control terminal connected to the signal input terminal Gout(n−1). The signal input terminal Gout(n−1) may control the second node PD to be connected with the second voltage terminal VOL. The first clock signal terminal CLK may control the second node PD to be connected with the compensation signal terminal CKV. The first clock signal terminal CLK and the second clock signal terminal CLKB may input signals of opposite polarities in the scanning periods, and may both input a turn-off signal in the blanking periods.

For half of a scanning period, the first clock signal terminal CLK and the second clock signal terminal CLKB may each output a turn-on signal. That is, for half of a scanning period, the voltage applied between the first control terminal and the second terminal of the third pull-down unit 700 may be a positive voltage. Similarly, the voltage applied between the third control terminal and the second terminal of the pull-down control unit 300 may be a positive voltage. The positive voltages may cause the threshold voltages of the TFTs, used in the third pull-down unit 700 and the pull-down control unit 300, to have positive shifts.

Thus, in the disclosed shift register, by applying the compensation signal terminal CKV, the voltage applied between the first control terminal and the second terminal of the third pull-down unit 700 may have opposite polarities in the scanning periods and the blanking periods. Similarly, the voltage applied between the third control terminal and the second terminal of the pull-down control unit 300 may have opposite polarities in the scanning periods and the blanking periods. That is, for the threshold voltage of a TFT used in the third pull-down unit 700 or in the pull-down control unit 300, the positive shift generated during a scanning period may be offset by the negative shift generated during a blanking period. Accordingly, the total shift of the threshold voltage of a TFT may be reduced. Instability or failure of a TFT caused by threshold voltage shift, after operating for a long period of time, may be reduced or eliminated.

In some embodiments, as shown in FIG. 4, the first terminal and the control terminal of the input unit 100 may both be connected to the signal input terminal Gout(n−1). When the signal input terminal Gout(n−1) inputs a turn-on signal, the input unit 100 may pull up the voltage level at the first node PU.

Figure 5:
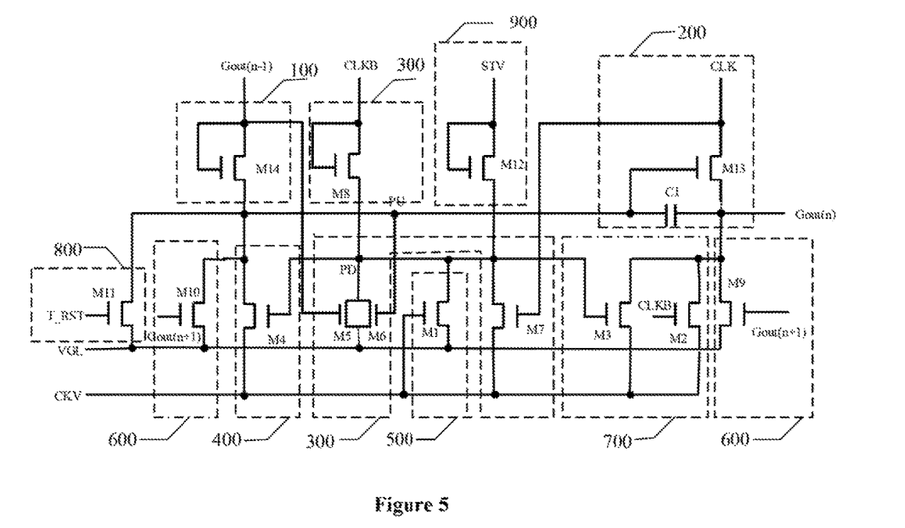
FIG. 5 illustrates another exemplary structure of a shift register according to various disclosed embodiments of the present disclosure.

FIG. 5 illustrates an exemplary circuit diagram, including the units and parts, of the disclosed shift register. It should be noted that, in the disclosed embodiments, the control terminal of a unit may refer to the gate electrode of a TFT included in the unit. The source electrode or the drain electrode of a TFT included in a unit may represent the first terminal, the second terminal, or the alike of the corresponding unit. Whenever possible, the source electrode and the drain electrode may exchange in suitable applications or embodiments.

In some embodiments, the second pull-down unit 500 may be implemented in a plurality of different structures to realize the described functions. For example, as shown in FIG. 5, the second pull-down unit 500 may include a first TFT M1. The gate electrode of the first TFT M1 may be connected to the compensation signal terminal CKV. The source electrode of the first TFT M1 may be connected to the first voltage terminal VGL. The drain electrode of the first TFT M1 may be connected to the second node PD. In a scanning period, in some embodiments, because the compensation signal terminal CKV inputs a turn-off signal, the first TFT M1 may be turned off. In a blanking period, in some embodiments, because the compensation signal terminal CKV inputs a turn-on signal, the first TFT M1 may be turned on to connect the second node PD with the second voltage terminal VGL. The voltage level of the second node PD may be pulled down.

In some embodiments, the third pull-down unit 700 may be implemented in a plurality of different structures to realize the described functions. For example, as shown in FIG. 5, the third pull-down unit 700 may include a second TFT M2. The gate electrode of the second TFT M2 may be connected to the second clock signal terminal CLKB. The source electrode of the second TFT M2 may be connected to the signal output terminal Gout(n). The drain electrode of the second TFT M2 may be connected to the compensation signal terminal CKV.

In a scanning period, when the second clock signal terminal CLKB inputs a turn-on signal to the second TFT M2, the second TFT M2 may be turned on. The second TFT M2 may thus connect the signal output terminal Gout(n) and the compensation signal terminal CKV to eliminate or reduce noise outputted by the signal output terminal Gout (n), where the compensation signal terminal CKV functions as a second voltage terminal that inputs a turn-off signal to the second TFT M2. For half of a scanning period, the voltage applied between the gate electrode and the drain electrode of the second TFT M2 and may be positive so that the threshold voltage of the second TFT M2 may undergo a positive shift. In a blanking period, the compensation signal terminal CKV may input a turn-on signal to the second TFT M2. The voltage applied between the gate electrode and the drain electrode of the second TFT M2 may be a negative voltage. That is, the voltage applied between the gate electrode and the drain electrode of the second TFT M2 may have opposite polarities in the scanning periods and in the blanking periods. Thus, in a blanking period, the threshold voltage of the second TFT M2 may undergo a negative shift. The negative shift may compensate the positive shift of the threshold voltage, of the second TFT M2, and the total shift of the second TFT M2 may be reduced.

Further, as shown in FIG. 5, the third pull-down unit 700 in the disclosed shift register may also include a second control terminal connected to the second node PD, a first terminal connected to the signal output terminal Gout(n), and a second terminal connected to the compensation signal terminal CKV. The third pull-down unit 700 may connect the signal output terminal Gout(n) and the compensation signal terminal CKV when the voltage level of the second node PD is high. Thus, noise outputted by the signal output terminal Gout(n) may be reduced or eliminated.

Accordingly, as shown in FIG. 5, the third pull-down unit 700 in the disclosed shift register may further include a third TFT M3. The gate electrode of the third TFT M3 may be connected to the second node PD. The source electrode of the third TFT M3 may be connected to the signal output terminal Gout(n). The drain electrode of the third TFT M3 may be connected to the compensation signal terminal CKV.

In a scanning period, when the voltage level of the second node PD is high, the third TFT M3 may be turned on so that the signal output terminal Gout(n) may be connected to the compensation signal terminal CKV to pull down the voltage level of the signal output terminal Gout(n). Noise outputted by the signal output terminal Gout(n) may be reduced or eliminated. Because the second node PD is connected to the second clock signal terminal CLKB, for half of a scanning period, a positive voltage may be applied between the gate electrode and the drain electrode of the third TFT M3. The threshold voltage of the third TFT M3 may undergo a positive shift. In a blanking period, the second pull-down unit 500 may pull down the voltage level of the second node PD. At this time, i.e., in the blanking period, the compensation signal terminal CKV may input a turn-on signal to the third TFT M3, and the voltage applied between the gate electrode and the drain electrode of the third TFT M3 may be a negative voltage. That is, the voltage applied between the gate electrode and the drain electrode of the third TFT M3 may have opposite polarities in scanning periods and in blanking periods. Thus, in a blanking period, the threshold voltage of the third TFT M3 may undergo a negative shift. The negative shift may compensate the positive shift of the threshold voltage of the third TFT M3, and the total shift of the third TFT M3 may be reduced.

In some embodiments, the first pull-down unit 400 in the disclosed shift register may be implemented in a plurality of different structures to realize the described functions. As shown in FIG. 5, the first pull-down unit 400 may include a fourth TFT M4. The gate electrode of the fourth TFT M4 may be connected to the second node PD. The source electrode of the fourth TFT M4 may be connected to the first node PU. The drain electrode of the fourth TFT M4 may be connected to the compensation signal terminal CKV.

In a scanning period, when the voltage level of the second node PD is high, the fourth TFT M4 may be turned on to connect the first node PU and the compensation signal terminal CKV. In the scanning period, the compensation signal terminal CKV may input a turn-off signal to the shift register so that the voltage level of the first node PU may be pulled down to low. Noise generated by the first node PU may be eliminated or reduced. Because the second node PD and the second clock signal terminal CLKB are connected, in half of a scanning period, a positive voltage may be applied between the gate electrode and the drain electrode of the fourth TFT M4. The threshold voltage of the fourth TFT M4 may undergo a positive shift.

In a blanking period, the compensation signal terminal CKV may input a turn-on signal to the fourth TFT M4. The voltage applied between the gate electrode and the drain electrode of the fourth TFT M4 may be a negative voltage. That is, the voltage applied between the gate electrode and the drain electrode of the fourth TFT M4 may have opposite polarities in scanning periods and in blanking periods. Thus, in a blanking period, the threshold voltage of the fourth TFT M4 may undergo a negative shift. The negative shift may compensate the positive shift of the threshold voltage of the fourth TFT M4, and the total shift of the fourth TFT M4 may be reduced.

In some embodiments, the pull-down control unit 300 may be implemented in a plurality of different structures to realize the described functions. For example, as shown in FIG. 5, the pull-down control unit 300 may include a fifth TFT M5, a sixth TFT M6, and a seventh TFT M7.

The gate electrode of the fifth TFT M5 may be connected to the signal input terminal Gout(n-1). The source electrode of the fifth TFT M5 may be connected to the second node PD. The drain electrode of the fifth TFT M5 may be connected to the second voltage terminal VGL.

The gate electrode of the sixth TFT M6 may be connected to the first node PU. The source electrode of the sixth TFT M6 may be connected to the second node PD. The drain electrode of the sixth TFT M6 may be connected to the second voltage terminal VGL.

The gate electrode of the seventh TFT M7 may be connected to the first clock signal terminal CLK. The source electrode of the seventh TFT M7 may be connected to the second node PD. The drain electrode of the seventh TFT M7 may be connected to the compensation signal terminal CKV.

In a scanning period, when the signal input terminal Gout(n-1) inputs a turn-on signal to the fifth TFT M5, the fifth TFT M5 may be turned on. Meanwhile, when the signal input terminal Gout(n-1) inputs a turn-on signal, the voltage level of the first node PU may be pulled up so that the sixth TFT M6 may be turned on. Thus, the turned-on sixth TFT M6 may connect the second node PD with the second voltage terminal VGL to reduce or eliminate noise generated by the second node PD.

Further, when the first clock signal terminal CLK inputs a turn-on signal to the seventh TFT M7, the seventh TFT M7 may be turned on so that the second node PD and the compensation signal terminal CKV may be connected. Noise generated by the second node PD may be reduced or eliminated. Because the first clock signal terminal CLK inputs a turn-on signal to the seventh TFT M7 for half of a scanning period, in this half of the scanning period, a positive voltage may be applied between the gate electrode and the drain electrode of the seventh TFT M7 and the threshold voltage of the seventh TFT M7 may undergo a positive shift. In a blanking period, the compensation signal terminal CKV may input a turn-on signal to the seventh TFT M7, and the voltage applied between the gate electrode and the drain electrode of the seventh TFT M7 may be a negative voltage. That is, the voltage applied between the gate electrode and the drain electrode of the seventh TFT M7 may have opposite polarities in scanning periods and in blanking periods. Thus, in a blanking period, the threshold voltage of the seventh TFT M7 may undergo a negative shift. The negative shift may compensate the positive shift of the threshold voltage of the seventh TFT M7, and the total shift of the seventh TFT M7 may be reduced.

Further, according to the disclosed shift register, in a scanning period, to ensure the voltage level of the second node PD can be pulled down when the voltage levels of the second clock signal terminal CLKB and the first node PU are both high, the pull-down control unit 300 may further include an eighth TFT M8 connected between the second clock signal terminal CLKB and the second node PD, as shown in FIG. 5. The gate electrode and the drain electrode of the eighth TFT M8 may be connected to the second clock signal terminal CLKB. The drain electrode of the eighth TFT M8 may be connected to the second node PD. In some embodiments, the dimension, e.g., a width, a length, and/or a width to length ratio, of the sixth TFT M6 may be greater than the dimension of the eighth TFT M8 so that the resistance of the sixth TFT M6 can be lower than the resistance of the eighth TFT M8. Thus, when the sixth TFT M6 and the eighth TFT M8 are both turned on, the voltage level of the second node PD may be pulled down.

In some embodiments, the reset unit 600 may be implemented in a plurality of different structures to realize the described functions. For example, as shown in FIG. 5, the reset unit 600 may include a tenth TFT M10.

The gate electrode of the tenth TFT M10 may be connected to the reset signal terminal Gout(n+1). The drain electrode of the tenth TFT M10 may be connected to the second voltage terminal VGL. The source electrode of the tenth TFT M10 may be connected to the first node PU.

In some embodiments, the reset unit 600 may further include a ninth TFT M9. The gate electrode of the ninth TFT M9 may be connected to the reset signal terminal Gout(n+1).

The drain electrode of the ninth TFT M9 may be connected to the second voltage terminal VGL. The source electrode of the ninth TFT M9 may be connected to the signal output terminal Gout(n).

In a scanning period, when the reset signal terminal Gout(n+1) inputs a turn-on signal to the ninth TFT M9 and the tenth TFT M10, the ninth TFT M9 and the tenth TFT M10 may be turned on. Thus, the voltage levels of the first node PU and the signal output terminal Gout(n) may be pulled down, and noise generated by the first node PU and the signal output terminal Gout(n) may be eliminated or reduced.

In some embodiments, the final-reset unit 800 may be implemented in a plurality of different structures to realize the described functions. For example, as shown in FIG. 5, the final-rest unit 800 may include an eleventh TFT M11. The gate electrode of the eleventh TFT M11 may be connected to the total reset signal terminal T_RST. The source electrode of the eleventh TFT M11 may be connected to the first node PU. The drain electrode of the eleventh TFT M11 may be connected to the second voltage terminal VGL. In the scanning periods, after the scanning of each frame, the total reset signal terminal T_RST may input a turn-on signal to the eleventh TFT M11 so that the eleventh TFT M11 may be turned on. The turned on eleventh TFT M11 may connect the first node PU with the second voltage terminal VGL to pull down the voltage level of the first node PU. Noise generated by the first node PU may be reduced or eliminated.

In some embodiments, the start-reset unit 900 in the disclosed shift register may be implemented in a plurality of different structures to realize the described functions. For example, as shown in FIG. 5, the start-reset unit 900 may include a twelfth TFT M12. The gate electrode and the source electrode of the twelfth TFT M12 may be connected to the frame-start signal terminal STV. The drain electrode of the twelfth TFT M12 may be connected to the second node PD. In a scanning period, when the scanning of a frame starts, the frame-start signal terminal STV may input a turn-on signal to the twelfth TFT M12. The twelfth TFT M12 may be turned on to pull up the voltage level of the second node PD so that the third TFT M3 and the fourth TFT M4 may be turned on. The voltage levels of the first node PU and the signal output terminal Gout(n) may be pulled down. Noise generated by the first node PU and the signal output terminal Gout(n) may be reduced or eliminated.

In some embodiments, the output control unit 200 in the disclosed shift register may be implemented in a plurality of different structures. For example, as shown in FIG. 5, the output control unit 200 may include a thirteenth TFT M13 and a capacitor C1. The gate electrode of the thirteenth TFT M13 may be connected to the first node PU. The source electrode of the thirteenth TFT M13 may be connected to the first clock signal terminal CLK. The drain electrode of the thirteenth TFT M13 may be connected to the signal output terminal Gout(n). The capacitor C1 may be connected between the first node PU and the signal output terminal Gout(n). In a scanning period, when the signal input terminal Gout(n−1) inputs a turn-on signal to the shift register, the voltage level of the first node PU may be pulled up to high. The thirteenth TFT M13 may be turned on to charge the capacitor C1. At this time, the first clock signal terminal CLK may input a turn-off signal to the thirteenth TFT M13 and the signal output terminal Gout(n) would not output a turn-on signal. In the next moment, when the first clock signal terminal CLK inputs a turn-on signal to the thirteenth TFT M13, the bootstrap effect of the capacitor C1 may enable the voltage level of the first node PU to be further pulled up. The thirteenth TFT M13 may remain on. The signal inputted by the first clock signal terminal CLK may be outputted to the signal output terminal Gout(n) through the thirteenth TFT M13. Thus, the signal output terminal Gout(n) may output a turn-on signal.

Further, after the signal input terminal Gout(n−1) inputs a turn-on signal to charge the first node PU, to prevent the first node PU from being discharged after the voltage level of the signal input terminal Gout(n−1) becomes low, the disclosed shift register may further include a fourteenth TFT M14. As shown in FIG. 5, the fourteenth TFT M14 may be connected between the signal input terminal Gout(n−1) and the first node PU. The gate electrode and the source electrode of the fourteenth TFT M14 may both be connected to the signal input terminal Gout(n−1). The drain electrode of the fourteenth TFT M14 may be connected to the first node PU. The fourteenth TFT M14 may prevent the first node PU from be discharged through the signal input terminal Gout(n−1) such that the voltage level of the first node PU may be kept high. In some embodiments, the source electrode of the fourteenth TFT M14 may be connected to a first voltage terminal VGH, which inputs a turn-on signal.

Figure 6:
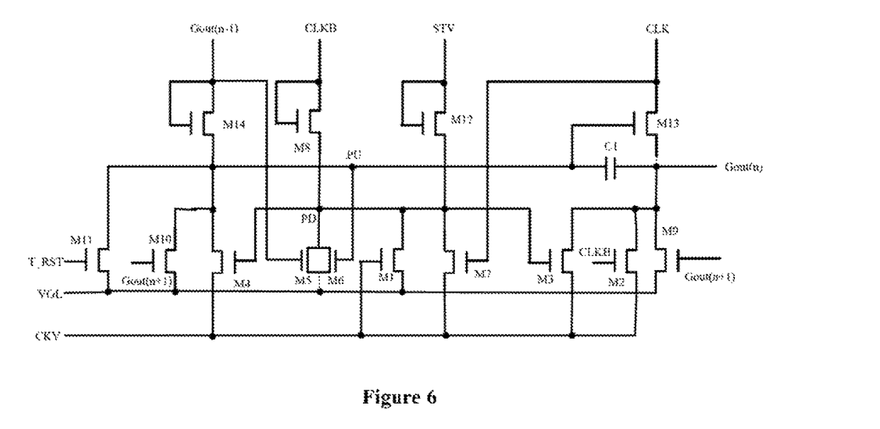
FIG. 6 illustrates an exemplary circuit diagram of a shift register according to various disclosed embodiments of the present disclosure.
Figure 7:
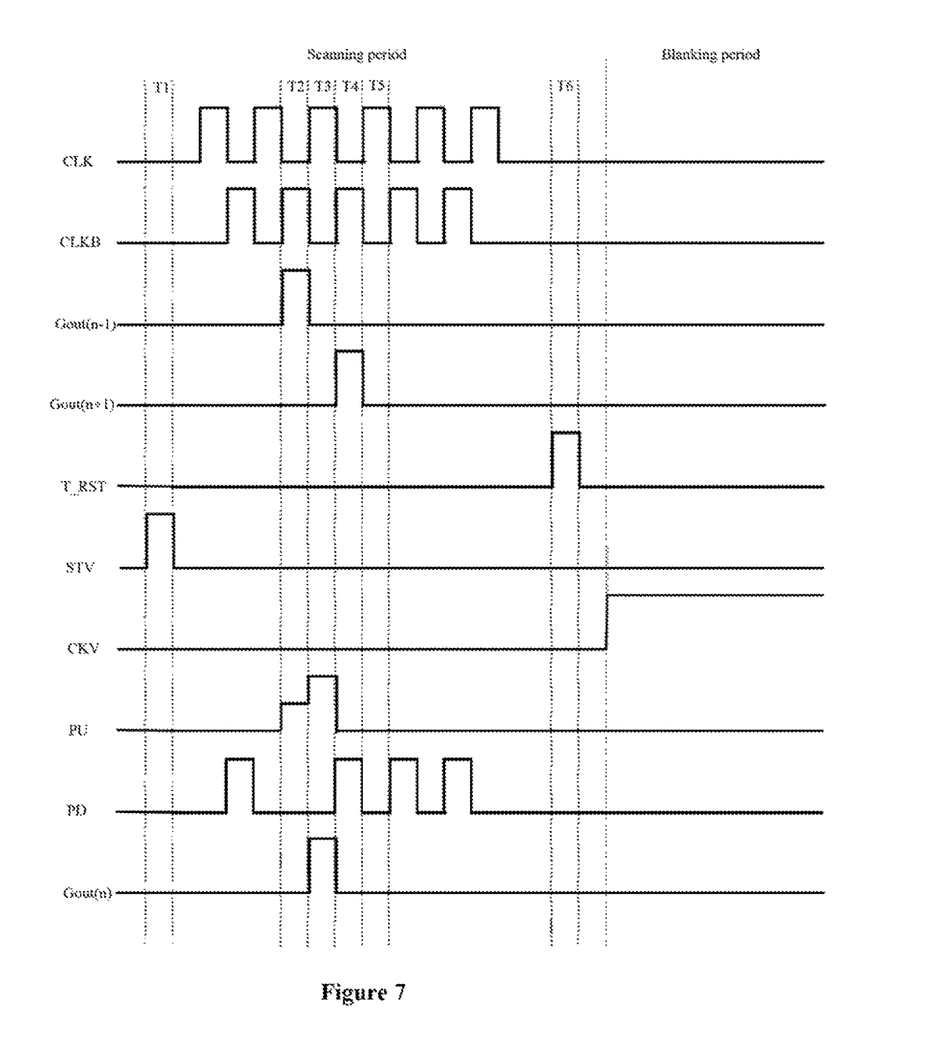
FIG. 7 illustrates other exemplary timing diagrams of certain signals according to various disclosed embodiments of the present disclosure.

The operation of the disclosed shift register may be described in details. FIG. 6 illustrates an exemplary circuit diagram of the disclosed shift register. FIG. 7 illustrates timing diagrams of certain input signals and output signals exemplified in the circuit structure shown in FIG. 6. The operation may be described in six phases, i.e., T1 to T6. In the following description, 1 represents a turn-on signal or turn-on voltage, and 0 represents a turn-off signal or turn-off voltage. Equal sign "=" is used to represent a signal or voltage provided by the corresponding terminal.

In phase T1, STV=1, CLKB=0, Gout(n−1)=0, CLK=0, Gout(n+1)=0, T_RST=0, CKV=0. Because STV=1, the twelfth TFT M12 may be turned on, the frame-start signal terminal STV may pull up the voltage level of the second node PD through the twelfth TFT M12. The second node PD, having a high voltage level, may turn on the third TFT M3 and the fourth TFT M4, so that the signal output terminal Gout(n) and the first node PU may be connected to the compensation signal terminal CKV. The voltage levels of the signal output terminal Gout(n) and the first node PU may be pulled down. Thus, the signal output terminal Gout(n) and the first node PU may output less or no noise.

In phase T2, STV=0, CLKB=1, Gout(n−1)=1, CLK=0, Gout(n+1)=0, T_RST=0, CKV=0. Because CLKB=1, the second TFT M2 may be turned on, and the voltage level of the signal output terminal Gout(n) may be pulled down. Because Gout(n−1)=1, the fifth TFT M5 may be turned on, and the voltage level of the second node PD may be pulled down. Meanwhile, because Gout(n−1)=1, the fourteenth TFT M14 may be turned on to pull up the voltage level of the first node PU. Accordingly, the thirteenth TFT M13 may stay on and charge the capacitor C1. At this time, CLK=0, so that the signal output terminal Gout(n) would not output a turn-on signal. Also, the first node PU, having a high voltage level, may turn on the sixth TFT M6 and pull down the voltage level of the second node PD.

In phase T3, STV=0, CLKB=0, Gout(n−1)=0, CLK=1, Gout(n+1)=0, T_RST=0, CKV=0. Because CLK=1, the seventh TFT M7 may be turned on to maintain the low voltage level of the second node PD. Meanwhile, because of the bootstrap effect of the capacitor C1, the voltage level of the first node PU may be further pulled up. The thirteenth TFT M13 may remain on. The first clock signal terminal CLK may input a signal to the signal output terminal Gout(n) through the thirteenth TFT M13. At this time, the signal output terminal Gout(n) may output a turn-on signal.

In phase T4, STV=0, CLKB=1, Gout(n−1)=0, CLK=0, Gout(n+1)=1, T_RST=0, CKV=0. Because Gout(n+1)=1, the ninth TFT M9 and the tenth TFT M10 may be turned on to connect the signal output terminal Gout(n) and the first node PU with the second voltage terminal VGL, respectively. The ninth TFT M9 may pull down the voltage level of the signal output terminal Gout(n) and the tenth TFT M10 may pull down the voltage level of the first node PU. Noise outputted by the signal output terminal Gout(n) and the first node PU may be reduced or eliminated. Because CLKB=1, the voltage level of the second node PD may be high such that the third TFT M3 and the fourth TFT M4 may be turned on. The third TFT M3 may further pull down the voltage level of the signal output terminal Gout(n) and the fourth TFT M4 may further pull down the voltage level of the first node PU. Meanwhile, because CLKB=1, the second TFT M2 may be turned on, and the voltage level of the signal output terminal Gout(n) may be pulled down. The signal output terminal Gout(n) may output a turn-off signal.

In phase T5, STV=0, CLKB=0, Gout(n−1)=0, CLK=1, Gout(n+1)=0, T_RST=0, CKV=0. Because CLK=1, the seventh TFT M7 may be turned on, and the voltage level of the second node PD may be pulled down. The voltage level of the first node PU may remain low.

Also, between phase T5 and phase T6, the second clock signal terminal CLKB may periodically charge the second node PD. When the voltage level of the second node PD is high, the third TFT M3 and the fourth TFT M4 may be turned on. Noise outputted by the first node PU and the signal output terminal Gout(n) may be reduced or eliminated.

In phase T6, STV=0, CLKB=0, Gout(n−1)=0, CLK=0, Gout(n+1)=0, T_RST=1, CKV=0. Because T_RST=1, the eleventh TFT M11 may be turned on so that the voltage level of the first node PU may remain low.

In a blanking period, STV=0, CLKB=0, Gout(n−1)=0, CLK=0, Gout(n+1)=0, T_RST=0, CKV=1. Because CKV=1, the first TFT M1 may be turned on and the voltage level of the second node PD may be pulled down. Thus, a voltage with an opposite polarity may be applied on the gate electrode and the drain electrode of the second TFT M2, the gate electrode and the drain electrode of the third TFT M3, the gate electrode and the drain electrode of the fourth TFT M4, and the gate electrode and the drain electrode of the seventh TFT M7. Accordingly, the threshold voltages of the second TFT M2, the third TFT M3, the fourth TFT M4, and the seventh TFT M7 may undergo a negative shift. The threshold voltages of the second TFT M2, the third TFT M3, the fourth TFT M4, and the seventh TFT M7 may be compensated and the total shifts of the threshold voltages may be reduced.

FIG. 6 illustrates an exemplary circuit diagram of the shift register. As shown in FIG. 6, the shift register may include a first TFT M1, a second TFT M2, a third TFT M3, a fourth TFT M4, a fifth TFT M5, a sixth TFT M6, a seventh TFT M7, an eighth TFT M8, a ninth TFT M9, a tenth TFT M10, an eleventh TFT M11, a twelfth TFT M12, a thirteenth TFT M13, a fourteenth TFT M14, and a capacitor C1.

The gate electrode of the second TFT M2 may be connected to the second clock signal terminal CLKB. The source electrode of the second TFT M2 may be connected to the signal output terminal Gout(n). The drain electrode of the second TFT M2 may be connected to the compensation signal terminal CKV.

The gate electrode of the fourth TFT M4 may be connected to the second node PD. The source electrode of the fourth TFT M4 may be connected to the first node PU. The drain electrode of the fourth TFT M4 may be connected to the compensation signal terminal CKV.

The gate electrode of the fifth TFT M5 may be connected to the signal input terminal Gout(n−1). The source electrode of the fifth TFT M5 may be connected to the second node PD. The drain electrode of the fifth TFT M5 may be connected to the second voltage terminal VGL.

The gate electrode of the sixth TFT M6 may be connected to the first node PU. The source electrode of sixth TFT M6 may be connected to the second node PD. The drain electrode of the sixth TFT M6 may be connected to the second voltage terminal VGL.

The gate electrode of the seventh TFT M7 may be connected to the first clock signal terminal CLK. The source electrode of the seventh TFT M7 may be connected to the second node PD. The drain electrode of the seventh TFT M7 may be connected to the compensation signal terminal CKV.

The gate electrode and the source electrode of the eighth TFT M8 may each be connected to the second clock signal terminal CLKB. The drain electrode of the eighth TFT M8 may be connected to the second node PD.

The gate electrode of the thirteenth TFT M13 may be connected to the first node PU. The source electrode of the thirteenth TFT M13 may be connected to the first clock signal terminal CLK. The drain electrode of the thirteenth TFT M13 may be connected to the signal output terminal Gout(n).

The gate electrode of the fourteenth TFT M14 may be connected to the signal input terminal Gout(n−1). The drain electrode of the fourteenth TFT M14 may be connected to the first node PU. The source electrode of the fourteenth TFT M14 may be connected to the signal input terminal Gout(n−1) or the first voltage terminal VGH, depending on the embodiments.

The capacitor C1 may be connected between the first node PU and the signal output terminal Gout(n).

In some embodiments, as shown in FIG. 6, the disclosed shift register may further include a first TFT M1. The gate electrode of the first TFT M1 may be connected to the compensation signal terminal CKV. The source electrode of the first TFT M1 may be connected to the second node PD. The drain electrode of the first TFT M1 may be connected to the second voltage terminal VGL.

In some embodiments, as shown in FIG. 6, the disclosed shift register may further include a third TFT M3. The gate electrode of the third TFT M3 may be connected to the second node PD. The source electrode of the third TFT M3 may be connected to the signal output terminal Gout(n). The drain electrode of the third TFT M3 may be connected to the compensation signal terminal CKV.

In some embodiments, as shown in FIG. 6, the disclosed shift register may further include a ninth TFT M9 and a tenth TFT M10.

The gate electrode of the ninth TFT M9 may be connected to the reset signal terminal Gout(n+1). The source electrode of the ninth TFT M9 may be connected to the signal output terminal Gout(n). The drain electrode of the ninth TFT M9 may be connected to the second voltage terminal VGL.

The gate electrode of the tenth TFT M10 may be connected to the reset signal terminal Gout(n+1). The source electrode of the tenth TFT M10 may be connected to the first node PU. The drain electrode of the tenth TFT M10 may be connected to the second voltage terminal VGL.

In some embodiments, as shown in FIG. 6, the disclosed shift register may further include an eleventh TFT M11. The gate electrode of the eleventh TFT M11 may be connected to the total reset signal terminal T_RST. The source electrode of the eleventh TFT M11 may be connected to the first node PU. The drain electrode of the eleventh TFT M11 may be connected to the second voltage terminal VGL.

In some embodiments, as shown in FIG. 6, the disclosed shift register may further include a twelfth TFT M12. The gate electrode and the source electrode of the twelfth TFT M12 may each be connected to the frame-start signal terminal STV. The drain electrode of the twelfth TFT M12 may be connected to the second node PD.

Another aspect of the present disclosure provides a GOA circuit.

Figure 8:
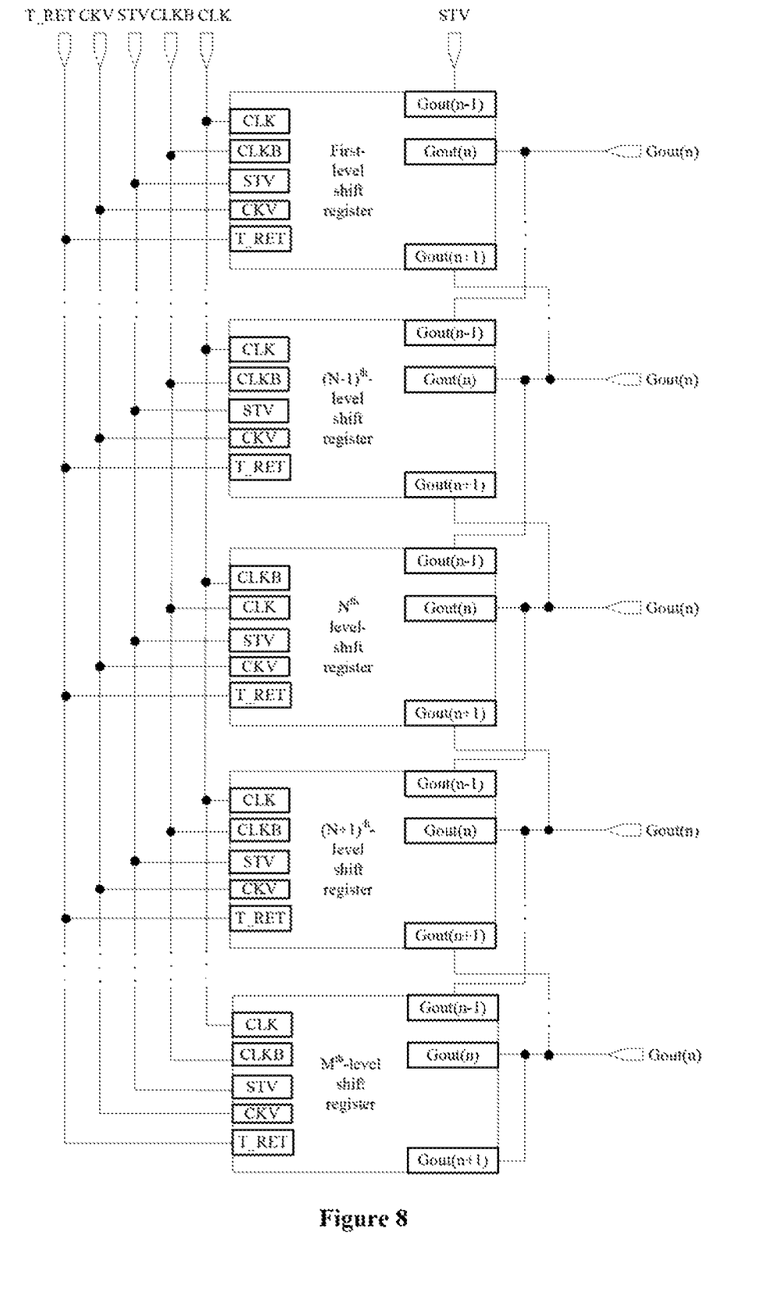
FIG. 8 illustrates an exemplary GOA circuit according to various disclosed embodiments of the present disclosure.

FIG. 8 illustrates an exemplary structure of the GOA circuit. The GOA circuit may include a plurality of cascading shift registers that are disclosed by the present disclosure. Except for the last shift register, the signal output terminal Gout(n) of each shift register may input a triggering signal to the signal input terminal Gout(n−1) of the next and adjacent shift register.

Further, in the disclosed GOA, except for the first shift register, the signal output terminal Gout(n) of each shift register may input a reset signal to the reset signal terminal Gout(n+1) of the adjacent and previous shift register.

FIG. 8 illustrates the structure of an exemplary GOA. The GOA may include five cascading shift registers. The signal output terminal Gout(n) of the $N^{th}$-level shift register may input a reset signal to the $(N-1)^{th}$-level shift register, and may simultaneously input a triggering signal to the $(N+1)^{th}$-level shift register.

Another aspect of the present disclosure provides a related display device. The display device may include the disclosed GOA circuit. The GOA circuit may provide scanning signals to the gate lines on the array substrate in the display device. Details of the operation may be referred to the description on the GOA circuit and the shift registers and are not repeated herein.

Another aspect of the present disclosure provides a display device. The display device may include one or more of the disclosed GOA circuits.

Embodiments of the present disclosure provide a shift register, a GOA circuit, and a related display device. In the shift register, the compensation signal terminal is configured to be used as a second voltage terminal in the scanning periods, and used as a turn-on signal terminal in the blanking periods. The compensation signal terminal may be connected to the first input terminal of the first pull-down unit and the second input terminal of the pull-down control unit. The first control terminal of the first pull-down unit may be connected to the second clock signal terminal. The third control terminal of the pull-down control unit may be connected to the first clock signal terminal. The first clock signal terminal and the second clock signal terminal may provide signals of opposite polarities in the scanning periods, and may both provide turn-off signals in the blanking periods.

Thus, the voltage applied between the first control terminal and the second terminal of the first pull-down unit, in a scanning period and in a blanking period, may have opposite polarities. Similarly, the voltage applied between the third control terminal and the second terminal of the pull-down control unit, in a scanning period and in a blanking period, may have opposite polarities. Thus, for the TFTs used in the first pull-down unit and the pull-down control unit, positive shifts of threshold voltages generated during a scanning period may be offset or reduced by the negative shifts of the threshold voltages generated during a blanking period. The total shifts of the threshold voltages may be reduced or eliminated. Instability or failure caused by shift of threshold voltages after long-time operations may be reduced or prevented.

Figure 9:
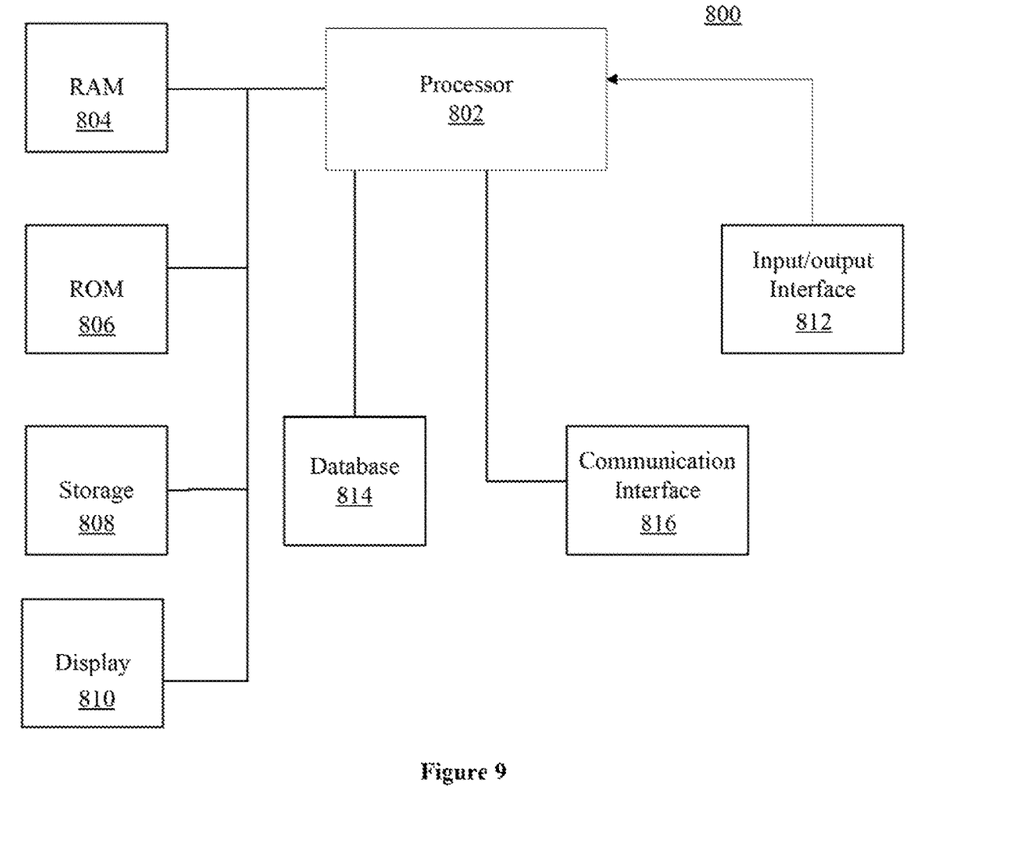
FIG. 9 illustrates a block diagram of a processing unit according to various disclosed embodiments of the present disclosure.

A processing unit may be used to control the operation of the shift registers. FIG. 9 illustrates the block diagram of the processing unit 800.

The processing unit 800 may receive, process, and execute commands from the display device. The processing unit 800 may include any appropriately configured computer system. As shown in FIG. 9, the processing unit 800 may include a processor 802, a random access memory (RAM) 804, a read-only memory (ROM) 806, a storage 808, a display 810, an input/output interface 812, a database 814; and a communication interface 816. Other components may be added and certain components/devices may be removed without departing from the principles of the disclosed embodiments.

Processor 802 may include any appropriate type of general purpose microprocessor, digital signal processor or microcontroller, and application specific integrated circuit (ASIC). Processor 802 may execute sequences of computer program instructions to perform various processes associated with the processing 802. Computer program instructions may be loaded into RAM 804 for execution by processor 802 from read-only memory 806, or from storage 808. Storage 808 may include any appropriate type of mass storage provided to store any type of information that processor 802 may need to perform the processes. For example, storage 808 may include one or more hard disk devices, optical disk devices, flash disks, or other storage devices to provide storage space.

Display 810 may provide information to a user or users of the processing unit 800. Display 810 may include any appropriate type of computer display device or electronic device display (e.g., CRT or LCD based devices). Input/output interface 812 may be provided for users to input information into the processing unit 800 or for the users to receive information from the processing unit 800. For example, input/output interface 812 may include any appropriate input device, such as a keyboard, a mouse, an electronic tablet, voice communication devices, touch screens, or any other optical or wireless input devices. Further, input/output interface 812 may receive from and/or send to other external devices.

Further, database 814 may include any type of commercial or customized database, and may also include analysis tools for analyzing the information in the databases. Database 814 may be used for storing information for operating the shift registers. Communication interface 816 may provide communication connections such that the processing unit 800 may be accessed remotely and/or communicate with other systems through computer networks or other communication networks via various communication protocols, such as transmission control protocol/internet protocol (TCP/IP), hyper text transfer protocol (HTTP), etc.

In one embodiment. The processor 802 may process and execute the commands stored in the database 814 to control the signal lines to input/output signals according to desired sequences. The processor 802 may communicate with the signal lines, e.g., send and receive signals, through the communication interface 816. Suitable data may be stored in ROM 806 and storage 808 to be processed. After the data is processed, result of the operation can be stored in ROM 806 or storage 808, or returned to the user via the display 810 or the input/output interface 812.

It should be understood that the above embodiments disclosed herein are exemplary only and not limiting the scope of this disclosure. Without departing from the spirit and scope of this invention, other modifications, equivalents, or improvements to the disclosed embodiments are obvious to those skilled in the art and are intended to be encompassed within the scope of the present disclosure.

What is claimed is:

1. A shift register, comprising:
an input unit, an output control unit, a first pull-down unit, a second pull-down unit, a reset unit, and a pull-down control unit, wherein:
the input unit comprises a control terminal connected to a signal input terminal, a first terminal connected to a first voltage terminal, and a second terminal connected to a first node;
the output control unit comprises a control terminal connected to the first node, a first terminal connected to a first clock signal terminal, and a second terminal connected to a signal output terminal;
the first pull-down unit comprises a control terminal connected to a second node, a first terminal connected to the first node, and a second terminal connected to a compensation signal terminal;
the second pull-down unit comprises a control terminal connected to the compensation signal terminal, a first terminal connected to the second node, and a second terminal connected to a second voltage terminal;
the pull-down control unit comprises a first control terminal connected to the signal input terminal, a second control terminal connected to the first node, a first terminal connected to the second node, a second terminal connected to the second voltage terminal;
the reset unit comprises a control terminal connected to a reset signal terminal, a first terminal connected to the first node, a second terminal connected to the second voltage terminal;
the first clock signal terminal and a second clock signal terminal input signals of opposite polarities in a scanning period in a frame, and input a turn-off signal in a blanking period in a frame; and
the compensation signal terminal inputs a turn-off signal in the scanning period in a frame and inputs a turn-on signal in the blanking period in a frame.

2. The shift register according to claim 1, the second pull-down unit comprising a first thin-film transistor (TFT), wherein the first TFT comprises: a gate electrode connected to the compensation signal terminal, a source electrode connected to a second voltage terminal, a drain electrode connected to the second node.

3. The shift register according to claim 1, the first pull-down unit comprising a fourth TFT, wherein the fourth TFT comprises: a gate electrode connected to the second node, a source electrode connected to the first node, and a drain electrode connected to the compensation signal terminal.

4. The shift register according to claim 1, the output control unit comprising a thirteenth TFT and a capacitor, wherein the thirteenth TFT comprises: a gate electrode connected to the first node, a source electrode connected to the first clock signal terminal, and a drain electrode connected to the signal output terminal, the capacitor being connected between the first node and the signal output terminal.

5. The shift register according to claim 1, further comprising a third pull-down unit, wherein the third pull-down unit comprises: a first control terminal connected to the second clock signal terminal, a first terminal connected to the signal output terminal, and a second terminal connected to the compensation signal terminal.

6. The shift register according to claim 5, the third pull-down unit comprising a second TFT, wherein the second TFT comprises: a gate electrode connected to the second clock signal terminal, a source electrode connected to the signal output terminal, a drain electrode connected to the compensation signal terminal.

7. The shift register according to claim 6, wherein the third pull-down unit further comprises a second control terminal connected to the second node, a turn-on signal inputted by the second control terminal connecting the compensation signal terminal with the signal output terminal.

8. The shift register according to claim 7, the third pull-down unit further comprising a third TFT, wherein the third TFT comprises: a gate electrode connected to the second node, a source electrode connected to the signal output terminal, and a drain electrode connected to the compensation signal terminal.

9. The shift register according to claim 1, the pull-down control unit comprising a sixth TFT and an eighth TFT, wherein:
the sixth TFT comprises: a gate electrode connected to the first node, a source electrode connected to the second node, and a drain electrode connected to the second voltage terminal; and
the eighth TFT comprises: a gate electrode and a drain electrode connected to the second clock signal terminal, and a source electrode connected to the second node.

10. The shift register according to claim 9, the pull-down control unit further comprising a third control terminal connected to the first clock signal terminal and a fourth control terminal connected to the signal input terminal.

11. The shift register according to claim 10, wherein the pull-down control unit further comprising a fifth TFT connected between the second voltage terminal and the second node, wherein the fifth TFT comprises: a gate electrode connected to the signal input terminal, a drain electrode connected to the second clock signal terminal, and a source electrode connected to the second voltage terminal.

12. The shift register according to claim 10, wherein the pull-down control unit further comprising a seventh TFT connected between the compensation signal terminal and the second node, wherein the seventh TFT comprises: a gate electrode connected the first clock signal terminal, a drain electrode connected to the compensation signal terminal, and a source electrode connected to the second node.

13. The shift register according to claim 1, the reset unit comprising a tenth TFT, wherein the tenth TFT comprises:
a gate electrode connected to the reset signal terminal; a drain electrode connected to the second voltage terminal; and a source electrode connected to the first node.

14. The shift register according to claim 13, the reset unit further comprising a ninth TFT connected between the output signal terminal and the second voltage terminal, wherein the ninth TFT comprises:
a gate electrode connected to the reset signal terminal; a drain electrode connected to the second voltage terminal; and a source electrode connected to the output signal terminal.

15. The shift register according to claim 1, further comprising a final-reset unit, the final-reset unit comprising a control terminal connected to a total reset signal terminal, an input terminal connected to the first node, and a second terminal connected to the second voltage terminal, wherein:
the final-reset unit connects the first node with the second voltage terminal when the total reset terminal inputs a turn-on signal to the final-reset unit.

16. The shift register according to claim 15, the final-reset unit comprising an eleventh TFT, wherein the eleventh TFT comprises a gate electrode connected to the total reset signal terminal, a source electrode connected to the first node, and a drain electrode connected to the second voltage terminal.

17. The shift register according to claim 1, further comprising a start-reset unit, wherein the start-reset unit comprises a control terminal and an input terminal connected to a frame-start signal terminal, and a second terminal connected to the second node, wherein: the start-reset unit pulls up the voltage level of the second node when the frame-start signal terminal inputs a turn-on signal to the start-reset unit.

18. The shift register according to claim 17, the start-reset unit comprising a twelfth TFT, wherein the twelfth TFT comprises a gate electrode and a source electrode connected to the frame-start signal terminal, and a drain electrode connected to the second node.

19. A gate-driver on array (GOA) circuit, comprising a plurality of cascading shift register according to claim 1, wherein:
except for a last shift register, the signal output terminal of one other shift register inputs a triggering signal to the signal input terminal of a next and adjacent shift register.

20. The GOA circuit according to claim 19, wherein:
except for a first shift register, the signal output terminal of one other shift register inputs a reset signal to the reset signal terminal of a previous and adjacent shift register.

21. A display device, comprising one or more of the GOA circuits according to claim 19.

* * * * *